United States Patent [19]
Bae

[11] Patent Number: 5,925,578
[45] Date of Patent: Jul. 20, 1999

[54] METHOD FOR FORMING FINE PATTERNS OF A SEMICONDUCTOR DEVICE

[75] Inventor: Sang Man Bae, Kyoungki-do, Rep. of Korea

[73] Assignee: Hyundai Electronics Industries Co., Ltd., Kyoungki-do, Rep. of Korea

[21] Appl. No.: 08/766,487

[22] Filed: Dec. 13, 1996

[30]     Foreign Application Priority Data

Dec. 29, 1995  [KR]   Rep. of Korea ..................... 95-66132

[51] Int. Cl.⁶ .............................................. H01L 21/302
[52] U.S. Cl. ........................... 438/736; 216/47; 430/312
[58] Field of Search ................................... 438/736, 738; 430/312; 216/47

[56]                References Cited

U.S. PATENT DOCUMENTS

| 4,275,286 | 6/1981 | Hackett, Jr. .................... 219/121 EK |
| 4,557,797 | 12/1985 | Fuller et al. ............................ 216/13 |
| 4,591,547 | 5/1986 | Brownell ................................ 430/312 |
| 5,087,535 | 2/1992 | Hirokane et al. ........................... 430/5 |
| 5,364,495 | 11/1994 | Van Der Tol et al. ................ 156/643 |
| 5,364,716 | 11/1994 | Nakagawa et al. ......................... 430/5 |
| 5,376,483 | 12/1994 | Rolfson ..................................... 430/5 |
| 5,688,365 | 11/1997 | Ogoshi ..................................... 216/47 |
| 5,741,625 | 4/1998 | Bae et al. ................................ 430/312 |
| 5,811,222 | 9/1998 | Gardner et al. ......................... 430/312 |

*Primary Examiner*—Bruce Breneman
*Assistant Examiner*—Anita Alanko
*Attorney, Agent, or Firm*—Gary M. Nath; Harold L. Novick; Nath & Associates

[57]                ABSTRACT

A method for forming fine patterns of a semiconductor device is disclosed and comprises the steps of: providing a semiconductor substrate; forming on the semiconductor substrate an objective layer to be etched; forming an intermediate layer over the objective layer; forming a first photoresist film over the intermediate layer; selectively exposing the first photoresist film through to a first exposure mask to light and create first photoresist patterns and thermally treating the first photoresist patterns; selectively etching the intermediate film to form intermediate patterns with the first photoresist patterns serving as a mask; forming a second photoresist film over the resulting structure; and selectively exposing the second photoresist film through a second exposure mask to light in such a manner that unexposed parts of the second photoresist film are partially overlapped with the first photoresist patterns, so as to form second photoresist patterns, whereby a significant improvement is brought into depth of focus, CD biasing and notching so that production yield and reliability are substantially enhanced

15 Claims, 2 Drawing Sheets

METHOD FOR FORMING FINE PATTERNS OF A SEMICONDUCTOR DEVICE

BACKGROUND OF THE INVENTION

1. Field of the Invention

The present invention relates to a method for forming fine patterns of a semiconductor device, whereby the high integration of a semiconductor device can be achieved.

2. Description of the Prior Art

Certainly, the recent tendency of high integration is greatly dependent on the developmental progress of techniques for forming fine patterns. For example, photoresist patterns are in general used as masks in etching or ion implantation and their fineness is, therefore, a very important factor in determining the degree of integration.

In this regard, a description will be given of conventional methods for forming fine photoresist patterns.

In an example, a semiconductor substrate on which a predetermined infrastructure has been established and curved patterns will be formed, is coated with a photoresist solution made by dissolving a certain ratio of photoresist agent and resin in a solvent, to give a photoresist film.

Subsequently, an exposure mask is prepared on a transparent substrate at the position which corresponds to the pattern to be formed in the photoresist film.

Next, light is illuminated through the exposure mask on the photoresist film to selectively polymerize the predetermined part of the photoresist film.

Then, the resulting semiconductor substrate is subjected to soft bake at 80–120° C. for 60–120 sec, followed by the development of the semiconductor substrate. For the development, a weak alkali solution consisting mainly of tetramethylammonium hydroxide is used to selectively remove the exposed/unexposed regions of the photoresist film.

Finally, the semiconductor substrate is washed with deionized water and dried, to obtain a photoresist pattern.

The resolution (R) of the photoresist pattern is proportional to the wavelength ($\lambda$) of the light source from a stepper and to the process parameter (k) and inversely proportional to the numerical aperture of the steper. Thus, in order to enhance the optical resolution of the stepper, a light source with short wavelength may be employed. For example, G-line (436 nm) and i-line (365 nm) steppers show limited process resolutions of about 0.7 and 0.5 $\mu$m, respectively. Shorter wavelength, for example, deep ultraviolet, is recruited for finer patterns with a size smaller than 0.5 $\mu$m. For example, the exposure process is carried out in a steper using as a light source a KrF laser with a wavelength of 248 nm or an ArF laser with a wavelength of 193 nm. Also, a contrast enhancement layer (CEL) or a phase shift mask may be used.

However, there is a limit in the recruitment of short wavelength as a light source and the CEL process is complicated by a poor production yield.

In order to better understand the background of the invention, another conventional method for forming fine patterns of semiconductor device will be described in conjunction with FIG. 1.

First, as shown in FIG. 1, a layer 2 to be etched, a lower photoresist film 3, an intermediate layer 4 and an upper photoresist film 5 are formed in sequence on a semiconductor substrate 1.

Next, an exposure mask 10 is prepared by forming narrow spaced light screen patterns 8 on a transparent substrate 6.

Then, light is illuminated through the exposure mask 10 selectively on the entire semiconductor substrate to form fine patterns (not shown).

According to another conventional technique, fine patterns are obtained by exposing a conventional tri-layer resist (hereinafter referred to as "TLR") two times to a light source via two exposure masks whose patterns are spaced enough not to generate the diffraction of the illuminated light.

In this TLR process, the process parameter is so small that the resolution is enhanced by more than 30% that obtainable in a mono-layer resist process. Also, the two times exposure in the TLR process allows the patterns to be finer than those obtained by using an ordinary mask.

However, the patterns less than 0.25 $\mu$m in size, necessary for highly integrated semiconductor devices of 256 M or higher, are difficult to obtain with the TLR process. In addition, since the previously formed photoresist patterns remain at a thickness of 0.4 $\mu$m during the repeat of photoresist coating and exposure, the photoresist film coated in the second round is poor in uniformity, which causes the depth of focus to become small and generates problems, such as CD biasing or notching, resulting in degradation in production yield and operation.

Therefore, it is apparent that all the above conventional techniques are not suitable for the high integration of a semiconductor device.

SUMMARY OF THE INVENTION

Therefore, it is an object of the present invention to overcome the above problems encountered in prior arts and to provide a method for forming fine patterns of a semiconductor device, whereby the fine patterns can be improved in thickness uniformity and narrowly space.

It is another object of the present invention to provide a method for forming fine patterns of a semiconductor device, which can bring a significant improvement into depth of focus, CD biasing and notching so that production yield and reliability is substantially enhanced.

It is a further object of the present invention to provide a method for forming fine patterns of a semiconductor device, whereby the high integration of a semiconductor device can be achieved.

In accordance with an aspect of the present invention, the above objectives could be accomplished by a provision of a method for forming fine patterns of semiconductor device comprises the steps of: providing a semiconductor substrate; forming on the semiconductor substrate an objective layer to be etched; forming an intermediate layer over the objective layer; forming a first photoresist film over the intermediate layer; selectively exposing the first photoresist film through to a first exposure mask to light to create first photoresist patterns and thermally treating the first photoresist patterns; selectively etching the intermediate film to form intermediate patterns with the first photoresist patterns serving as a mask; forming a second photoresist film over the resulting structure; and selectively exposing the second photoresist film through a second exposure mask to light in such a manner that unexposed parts of the second photoresist film are partially overlapped with the first photoresist patterns, so as to form second photoresist patterns.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

The application of the preferred embodiment of the present invention is best understood with reference to the accompanying drawings.

Referring to FIGS. 2 to 5, there are illustrated stepwise processes for forming fine patterns of semiconductor device, according to the present invention are illustrated stepwise.

Figure 1:
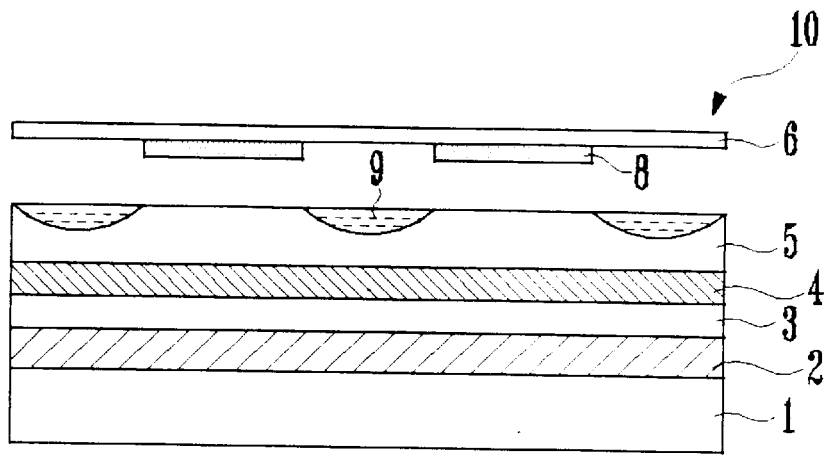
FIG. 1 is a schematic cross sectional view illustrating a conventional method for forming fine patterns of a semiconductor device.
Figure 2:
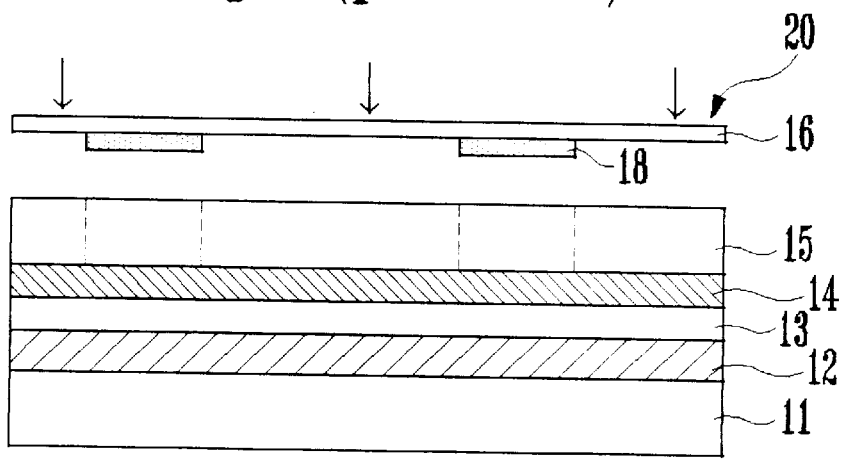
FIGS. 2 through 5 are schematic cross sectional views illustrating a method for forming fine patterns of a semiconductor device according to the present invention.

As shown in FIG. 2, a semiconductor substrate 11 is prepared in which a predetermined infrastructure, such as an element isolation oxide film (not shown), is formed. Then, a layer 12 to be etched into an interlayer insulating film or word line, made of polysilicon, is formed on the semiconductor substrate 11. In sequence, a lower photoresist film 13, an intermediate layer 14 and a first upper photoresist film 15 are formed on the layer 12 to be etched. Separately, a first exposure mask 20 is prepared by forming predetermined light screen patterns 18 on a transparent substrate 16.

Figure 3:
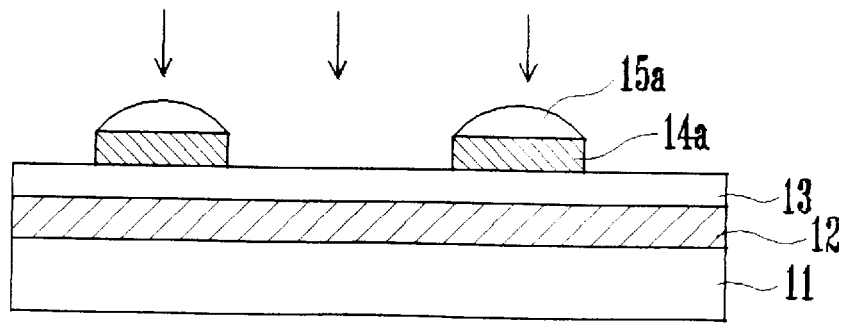

Next, as shown in FIG. 3, light with a predetermined wavelength is selectively illuminated through the first exposure mask 20 upon the semiconductor substrate.

In this regard, the first upper photoresist film 15 is a kind of positive photoresist in which that unexposed regions remain as patterns. For the intermediate layer 14, a material which is different from the upper photoresist film 15 in etch selection ratio is selected, for example, from SOG, chemical vapor deposition (hereinafter referred to as "CVD") oxide, nitride, Ti, TiN and Al type alloy. In the case of using Ti or TiN, the intermediate layer 14 is formed at a thickness of 500–1000 Angstrom. It is preferable that the intermediate layer of the Al type alloy is 0.5–1 $\mu$m thick.

Subsequently, a developing process is carried out to remove the exposed parts of the first upper photoresist film 15, so as to form first upper photoresist patterns 15a.

Thereafter, using the first upper photoresist pattern 15a as a mask, the intermediate layer 14 is selectively removed to form intermediate layer patterns 14a. At this moment, the first upper photoresist pattern 15a on the intermediate layer pattern 14a is partially removed with a remainder about 0.2–0.6 $\mu$m thick.

Then, in order to reduce the height of the remainding the first upper photoresist pattern 15a, a thermal treatment is carried out at 100–350° C. During the thermal treatment, the moisture within the remainding photoresist patterns 15a is evaporated to reduce the height thereof to about 0.05–0.2 $\mu$m.

When the intermediate patterns 14a are dry etched with the first upper photoresist patterns 15a serving as a mask, PAL within the first photoresist patterns 15a is broken and cured, which may result in preventing the damage of the solvent to a subsequent photoresist film to be formed.

Figure 4:
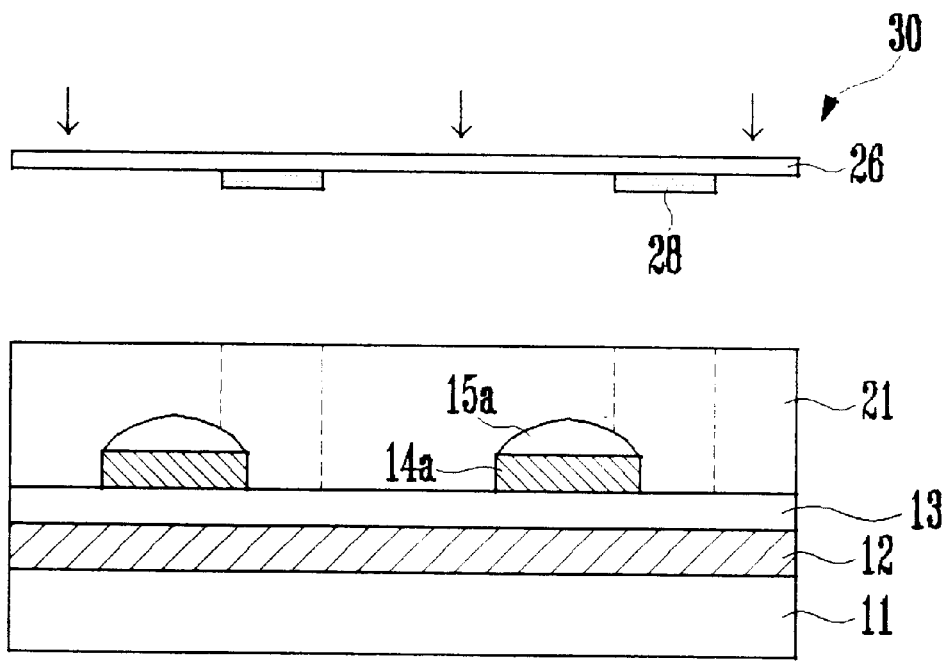

Next, as shown in FIG. 4, a second upper photoresist film 21 of a positive type is coated entirely over the resulting structure.

Separately, a second exposure mask 30 is prepared by forming light screen patterns 17 on a transparent substrate 26 in such a manner that they are partially overlapped with those of the first exposure mask 10.

Following this, light with a certain wavelength is illuminated through the second exposure mask 30 selectively upon the entire substrate structure.

Figure 5:
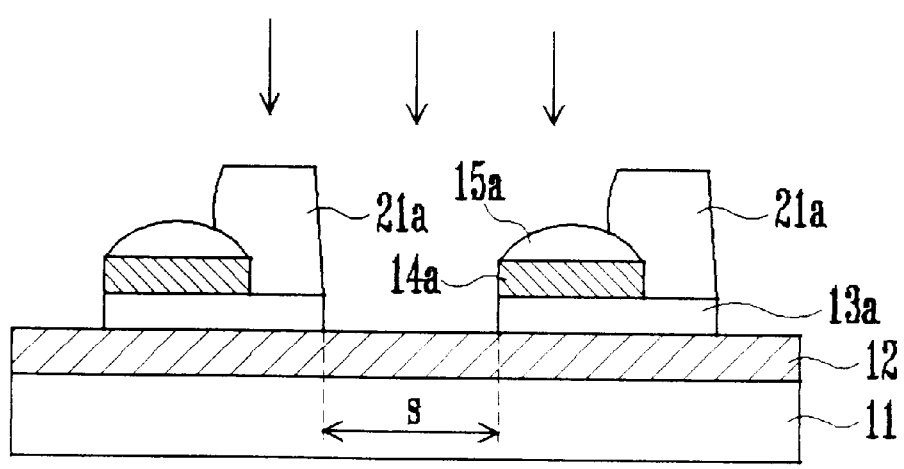

Next, as shown in FIG. 5, the exposed regions of the second upper photoresist patterns 21a are removed by a developing process, producing second upper photoresist patterns 21a.

Finally, using the second upper photoresist patterns 21a and the intermediate patterns 14a as a mask, the lower photoresist film 13 and the objective layer 12 are selectively etched to form fine patterns (not shown). The space (S) between the patterns is narrower than that between the patterns obtained by the conventional TLR process.

As described hereinbefore, the method according to the present invention is characteristic in several aspects.

First, using a first exposure mask with sufficiently spaced patterns in a first round of TLR process, the intermediate patterns are formed and thermally treated to reduce the height of the upper photoresist patterns.

Second, a second exposure mask whose light screen patterns are moved at a certain pitch relative to those of the first exposure mask, is used to create the second upper photoresist patterns and the intermediate patterns which are both in turn used to selectively etch the objective layer into narrow spaced fine patterns.

Therefore, the resultant fine patterns are superior in thickness uniformity and resolution in addition to being stably created by the method of the present invention. Whatmore, the method in accordance with the present invention has sufficient process allowance, which leads to a significant enhancement of production yield.

Consequently, the method of the present invention is suitable for the high integration of a semiconductor device.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for forming fine patterns of semiconductor device, comprising the steps of:

providing a semiconductor substrate;

forming an objective layer to be etched on the semiconductor substrate;

forming a first photoresist film over the objective layer;

forming an intermediate layer over the first photoresist film;

forming a second photoresist film over the intermediate layer;

selectively exposing the second photoresist film to a first exposure mask to light and patterning the second photoresist film to form a second photoresist pattern;

thermally treating the second photoresist pattern to reduce the thickness of the second photoresist pattern;

selectively etching the intermediate layer using the second photoresist pattern as a mask after the thermal treatment to form an intermediate layer pattern;

forming a third photoresist film over an exposed portion of the resulting etched intermediate layer structure; and selectively exposing the third photoresist film through a second exposure mask to light in such a manner that an unexposed portion of the third photoresist film is partially overlapped with the second photoresist pattern; and selectively etching the exposed portion of the third photoresist film to form a third photoresist film pattern.

2. A method in accordance with claim 1, further comprising the step of patterning the first photoresist film using said third photoresist film pattern and said thermally treated second photoresist film pattern as a mask to form a first phototresist film pattern.

3. A method in accordance with claim 1, wherein said second exposure mask comprises light screen patterns which overlaps partially with those of said first exposure mask.

4. A method in accordance with claim 1, wherein said intermediate layer is formed of SOG.

5. A method in accordance with claim 1, wherein said intermediate layer is formed of chemical vapor deposition oxide.

6. A method in accordance with claim 1, wherein said intermediate layer is formed of nitride.

7. A method in accordance with claim 1, wherein said intermediate layer is formed of Ti.

8. A method in accordance with claim 7, wherein said intermediate layer is formed at a thickness of about 500–1000 Angstrom.

9. A method in accordance with claim 1, wherein said intermediate layer is formed of TiN.

10. A method in accordance with claim 9, wherein said intermediate layer is formed at a thickness of about 500–1000 Angstrom.

11. A method in accordance with claim 1, wherein said intermediate layer is formed of Al group alloy.

12. A method in accordance with claim 11, wherein said intermediate layer is formed at a thickness of about 0.5–1 $\mu$m.

13. A method in accordance with claim 1, wherein said second photoresist patterns remains 0.2–0.6 $\mu$m thick on the said intermediate pattern after the formation of said intermediate pattern.

14. A method in accordance with claim 1, wherein said second photoresist pattern remains about 0.05–0.2 $\mu$m thick after said thermal treatment step.

15. A method in accordance with claim 1, wherein said thermal treatment step is carried out at a temperature of about 100–350° C.

* * * * *

UNITED STATES PATENT AND TRADEMARK OFFICE
CERTIFICATE OF CORRECTION

PATENT NO. : 5,925,578
DATED : July 20, 1999
INVENTOR(S) : Sang Man BAE

It is certified that error appears in the above-identified patent and that said Letters Patent is hereby corrected as shown below:

Claim 13, Line 2, delete " patterns " and insert --pattern--

Signed and Sealed this

Thirtieth Day of November, 1999

Q. TODD DICKINSON

Attest:

Attesting Officer

Acting Commissioner of Patents and Trademarks